(12) United States Patent
Nagata (10) Patent No.: US 6,661,270 B2
(45) Date of Patent: Dec. 9, 2003

(54) DATA LATCH CIRCUIT AND DRIVING METHOD THEREOF

(75) Inventor: Kyoichi Nagata, Tokyo (JP)

(73) Assignees: NEC Electronics Corporation, Kanagawa (JP); NEC Corporation, Tokyo (JP)

( * ) Notice: Subject to any disclaimer, the term of this patent is extended or adjusted under 35 U.S.C. 154(b) by 0 days.

(21) Appl. No.: 09/738,454

(22) Filed: Dec. 15, 2000

(65) Prior Publication Data

US 2001/0006350 A1 Jul. 5, 2001

(30) Foreign Application Priority Data

Dec. 22, 1999 (JP) ............................................ 11-365675

(51) Int. Cl.[7] .......................... H03K 3/289; H03K 3/356
(52) U.S. Cl. ....................................... 327/202; 327/203
(58) Field of Search ................................. 327/202, 203, 327/210, 211, 212, 218, 199, 200, 201

(56) References Cited

U.S. PATENT DOCUMENTS 4,495,628 A * 1/1985 Zasio ........................... 327/202
4,689,497 A * 8/1987 Umeki et al. ................ 327/202
5,189,315 A 2/1993 Akata ........................... 327/203
5,982,211 A * 11/1999 Ko ................................ 327/202
6,002,284 A * 12/1999 Hill et al. ..................... 327/202

FOREIGN PATENT DOCUMENTS

| DE | 3490015 C2 | 1/1984 | | |
| DE | 3443788 C2 | 11/1984 | | |
| DE | 19636083 A1 | 9/1996 | | |
| JP | 4-61414 | * | 2/1992 | ................. 327/202 |
| JP | 6-188695 | * | 7/1994 | ................. 327/202 |

* cited by examiner

*Primary Examiner*—Tuan T. Lam
(74) *Attorney, Agent, or Firm*—Choate, Hall & Stewart (57) ABSTRACT

A data latch circuit of the present invention, which corresponds to the semiconductor circuit, is provided with a master flip-flop and a slave flip-flop. The master flip-flop fetches a first signal in response to a first clock signal, holds first data corresponding to the first signal as binary data in response to the first clock signal, and also outputs the first data as a second signal. The slave flip-flop fetches the second signal in response to an OR-gated result obtained between the first clock signal and either one or a plurality of second clock signals, and the slave flip-flop holds second data corresponding to the second signal in response to the OR-gated result, and also the slave flip-flop outputs a third signal corresponding to the second data.

6 Claims, 9 Drawing Sheets

DATA LATCH CIRCUIT AND DRIVING METHOD THEREOF

BACKGROUND OF THE INVENTION

1. Field of the Invention

The present invention generally relates to a data latch circuit. More specifically, the present invention relates to a data latch circuit capable of latching data at high speed in response to a plurality of clock signals, and also relates to a method for driving such a high-speed data latch circuit.

2. Description of the Related Art

There is a Data latch circuit which latches data in response to the output from an OR-gate receiving a plurality of clock signals. For instance, the latch circuit is employed in such a case that a data latch circuit is operated at high speed under condition that only a clock signal having a low frequency may be supplied. Such condition is that, for instance, when a semiconductor device containing a data latch circuit is tested by way of a tester which can perform the test with a low frequency.

Into such a data latch circuit, two clock signals are supplied, the frequencies of which are equal to each other, but the phases of which are different from each other by "π". A signal produced by OR-gating these two clock signals owns a frequency two times higher than the low frequency of the clock signal. Even when only the clock signal having the low frequency can be supplied, the semiconductor circuit can be operated at high speed in a similar manner to the case where a clock signal having a high frequency is used.

Figure 11:
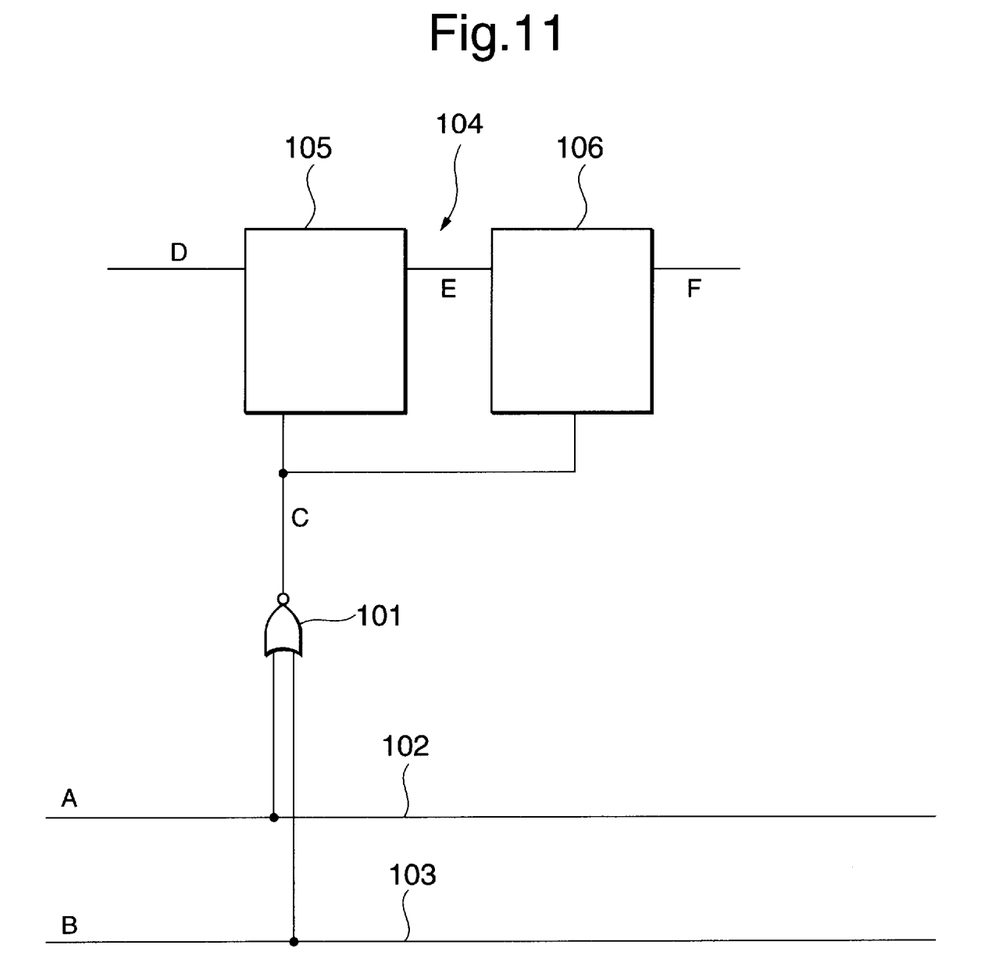
FIG. 11 is a schematic block diagram for showing the circuit arrangement of a data latch circuit of the related art.

FIG. 11 shows such a semiconductor circuit. The semiconductor circuit of the related art includes a NOR gate 101. Both a first clock signal line 102 and a second clock signal line 103 are connected to the input terminal of this NOR gate 101.

A first clock signal "A" is supplied to a first clock signal line 102. The first clock signal line 102 corresponds to such a signal line used to supply a clock signal to a plurality of circuits (circuits other than a flip-flop 104 are not shown). A second clock signal "B" is supplied to the second clock signal line 103. The second clock signal line 103 corresponds to such a signal line connected to a plurality of circuits (circuits other than the flip-flop 104 are not shown). The NOR gate 101 produces a local clock signal "C" having a NOR logic between the first clock signal "A" and the second clock signal "B", and then outputs this produced local clock signal "C" to another flip-flop 106.

The flip-flop 104 contains both a master flip-flop 105 and the slave flip-flop 106. The local clock signal "C" is inputted to both the master flip-flop 105 and the slave flip-flop 106.

An input signal "D" is entered into the master flip-flop 105. The master flip-flop 105 fixes a latch signal "E" after the voltage of the local clock signal "C" has been transferred from an "LO" voltage to a "HI" voltage, for a time duration during which the voltage of the local clock signal "C" is maintained at the "HI" voltage. Even when the input signal "D" is varied while the voltage of the local clock signal "C" is maintained at the HI voltage, the latch signal "E" is not varied. On the other hand, while the voltage of the local clock signal "C" is maintained at the "LO" voltage, the master flip-flop 105 directly outputs the data of the input signal "D" as the latch signal "E".

The slave flip-flop 106 latches the data of the latch signal "E" when the local clock signal "C" rises. At this time, the slave flip-flop 106 receives the data held by the master flip-flop 105. Even after the voltage of the local clock signal "C" has been returned to the "LO" voltage, the slave flip-flop 106 maintains to hold the data of the latch signal "E". The slave flip-flop 106 continuously holds the latched data until the local clock signal "E" rises at the next time. The slave slip-flop 106 outputs the held data as an output signal "F".

In particular, such a semiconductor circuit may be used as a semiconductor circuit selectively operable in the normal operation mode and the test mode. In the normal operation mode, the semiconductor circuit is operated in response to a clock signal employed in the semiconductor device. The test mode corresponds to such an operation mode under which the semiconductor circuit is tested. At this time, the clock signal is supplied by a tester.

There are some cases that the maximum operating frequency of the normal operation mode is higher than such a frequency which can be supplied by the tester. For example, the following case may be conceived. That is, the maximum operating frequency of the normal operation mode is equal to 200 MHz, whereas the maximum frequency of the clock signal which can be supplied by the tester is equal to 100 MHz.

In such a case, as to the semiconductor circuit shown in FIG. 11, the frequency of the clock signal supplied from the tester is multiplied and then the semiconductor circuit is operated based upon this clock signal having the multiplied frequency. Thus, even in such a case that the maximum operating frequency (for example, 100 MHz) of the tester is lower than the maximum operating frequency (for example, 100 MHz) of the semiconductor circuit, the functions of the semiconductor circuit can be tested by this tester.

The semiconductor circuit shown in FIG. 11 may be operated under better condition by using the clock signal having the low frequency in the test mode. However, this semiconductor circuit is erroneously operated in such a case that the clock signal having the high frequency is supplied in the normal operation mode.

The reason why such an erroneous operation of the semiconductor circuit occurs is given as follows: That is to say, since the capacity of the signal line used to supply the clock signal is large, the transfer time of the clock signal is prolonged. Alternatively, the waveform of the rising signal portion of the clock signal is deformed.

In the known semiconductor circuit indicated in FIG. 11, the reason why the capacity of the signal line used to supply the clock signal is increased is that this known semiconductor circuit employs the NOR gate 101. In this NOR gate 101, the capacity of the input terminal is large. Therefore, both the capacity of the first clock signal line 102 and the capacity of the second clock signal line 103 are increased. Increasing of the capacity owned by the signal line may probably induce the occurrence of an erroneous operation in case that the semiconductor circuit is operated at high speed. Such a semiconductor circuit is desired which may latch data in response to a plurality of clock signals, while a capacity of a signal line is reduced.

Also, in the known semiconductor circuit indicated in FIG. 11, the output of the NOR gate 101 is connected to both the master flip-flop 105 and the slave flip-flop 106. This NOR gate 101 requires such a drive-ability by which both the master flip-flop 105 and the slave flip-flop 106 may be driven in a proper condition. Such a fact that the maximum drive-ability of a logic gate under use is large may constitute a demerit with respect to a high-speed operation of a semiconductor circuit.

Accordingly, such a semiconductor circuit capable of latching data in response to a plurality of clock signals, while the maximum drive-ability of a logic gate under use is reduced, is wanted in this technical field.

SUMMARY OF THE INVENTION

An object of the present invention is to provide a semiconductor circuit for latching data in response to a plurality of clock signals, while a capacity of a signal line used to supply these clock signals is decreased. Another object of the present invention is to provide a semiconductor circuit for latching data in response to a plurality of clock signals, while the maximum drive-ability of a logic gate under use is decreased. The OR-gated result obtained from the first clock signal and the second clock signal is not inputted to the master flip-flop of the data latch circuit of the present invention. The load of the clock signal lines can be reduced.

signal (a) and the second clock signal (c).

BRIEF DESCRIPTION OF THE DRAWINGS

The above and other objects, features and advantages of the present invention will become more apparent from the following detailed description, when taken in conjunction with the accompanying drawings, wherein.

DETAILED DESCRIPTION OF THE PREFERRED EMBODIMENTS

Figure 1:
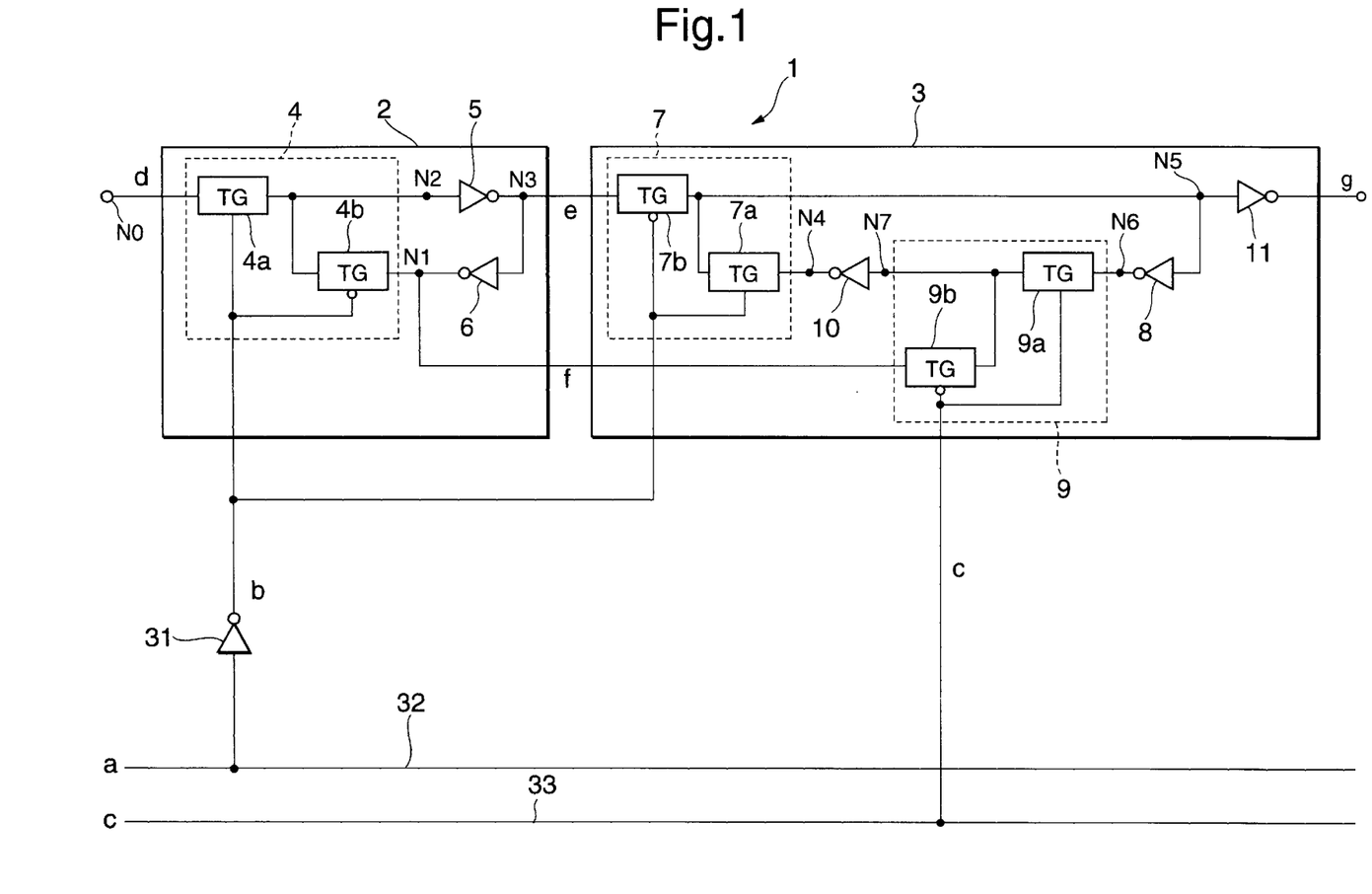
FIG. 1 is a schematic block diagram for indicating a circuit arrangement of a data latch circuit according to a first embodiment of the present invention.

FIG. 1 schematically shows a block circuit diagram of a semiconductor circuit, i.e., a latch circuit according to a first embodiment of the present invention. This semiconductor circuit is provided with an inverter and a flip-flop. As indicated in FIG. 1, a first clock signal line 32 is connected to an input terminal of an inverter 31. A clock signal "a" is supplied to the first clock signal line 32. The clock signal "a" corresponds to a signal having any one of a "HI (HIGH)" potential and a "LO (LOW)" potential. In this case, the "HI" potential corresponds to a power supply potential, and the "LO" potential corresponds to a ground potential. It should be understood that signals explained in the below-mentioned specification of the present invention corresponds to signals having any one of "HI" potentials and "LO" potentials.

The inverter 31 inverts the clock signal "a" to produce a local clock signal "b". In this case, the expression "a signal is inverted" implies that when a signal is present at a "HI" potential, the inverter 31 outputs a signal having a "LO" potential, whereas when a signal present at a "LO" potential, the inverter 31 outputs a signal having a "HI" potential.

The local clock signal "b" is entered into a flip-flop 1. Further, a clock signal "c" is inputted via a second clock signal line 33 to the flip-flop 1.

The flip-flop 1 contains both a master flip-flop 2 and a slave flip-flop 3. The local clock signal "b" is inputted to the master flip-flop 2. The local clock signal "b" corresponds to such a signal produced by inverting the above-described clock signal "a". Thus, the master flip-flop 2 is operated in response to the clock signal "a". Another input signal "d" is further inputted to the master flip-flop 2.

The master flip-flop 2 contains a selection switch 4. Both an input terminal N0 and a node N1 are connected to the input of the selection switch 4. The node N0 corresponds to such a node into which the input signal "d" is entered. The node N1 corresponds to such a node which holds positive logic data of data held by the master flip-flop 2. A producing process of a potential at the node N1 will be explained later.

The selection switch 4 contains both a transfer gate 4a and another transfer gate 4b. The transfer gate 4a is connected to the input terminal N0. This transfer gate 4a is brought into an ON state when the local clock signal "b" owns the "HI" potential. At this time, the input terminal N0 is connected to a node N2. The transfer gate 4a is brought into an OFF state when the local clock signal "b" owns the "LO" potential. At this time, the input terminal N0 is not connected to the node N2.

The transfer gate 4b is connected to the node N1. This transfer gate 4b is brought into an OFF state when the local clock signal "b" owns the "HI" potential. At this time, the node N1 is not connected to the node N2. The transfer gate 4b is brought into an ON state when the local clock signal "b" owns the "LO" potential. At this time, the node N1 is connected to the node N2.

Figure 2:
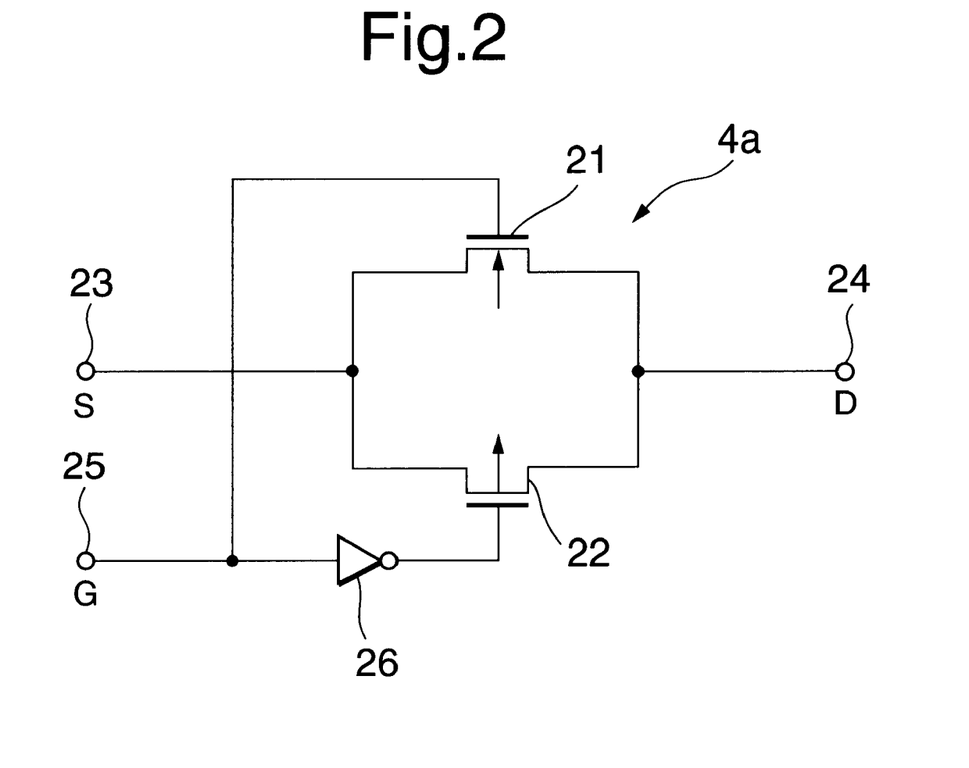
FIG. 2 shows a circuit arrangement of a transfer gate employed in the data latch circuit of FIG. 1.

FIG. 2 shows a circuit diagram of the transfer gate 4a. The transfer gate 4a is provided with an n-channel transistor 21 and a p-channel transistor 22. Both the source of the n-channel transistor 21 and the source of the p-channel transistor 22 are connected to a source terminal 23. Both the drain of the n-channel transistor 21 and the drain of the p-channel transistor 22 are connected to a drain terminal 24. The gate of the n-channel transistor 21 is connected to a gate terminal 25. The gate of the p-channel transistor 22 is connected via an inverter 26 to the gate terminal 25.

When a HI voltage ("HI" potential) is applied to the gate terminal 25, the source terminal 23 of the transfer gate 4a is electrically conducted to the drain terminal 24 thereof (ON state). When an LO voltage ("LO" potential) is applied to the gate terminal 25 of this transfer gate 4a, the source terminal 23 thereof is electrically cut from the drain terminal 24 thereof (OFF state).

Figure 3:
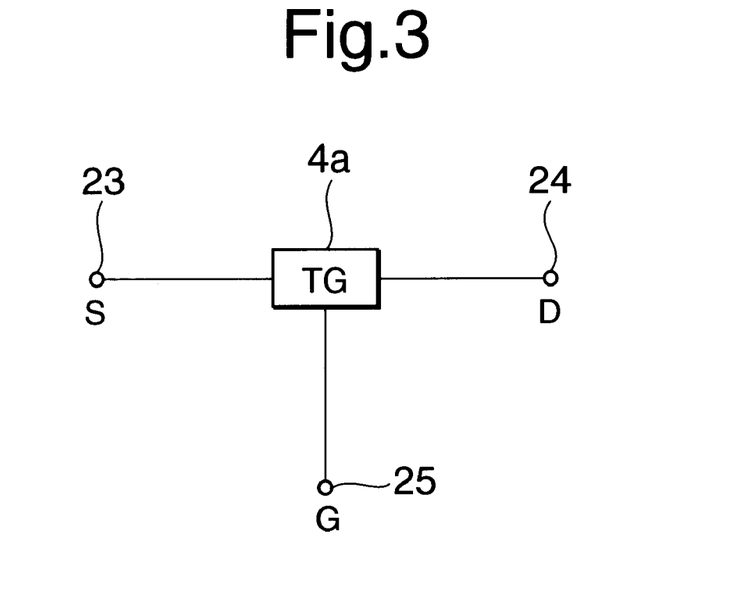
FIG. 3 is a diagram for explaining a indication symbol of the transfer gate shown in FIG. 2.

In this specification of the present invention, the transfer gate 4a shown in FIG. 2 is represented by employing a symbol shown in FIG. 3. In this symbol, lines connected to two short sides of a rectangle which surrounds a character of "TG" indicate either the source terminal or the drain terminal. Since the source terminal and the drain terminal are electrically equivalent to each other, no discrimination is made. A line connected to one long side of the rectangle which surrounds the character of "TG" denotes the gate terminal.

Figure 4:
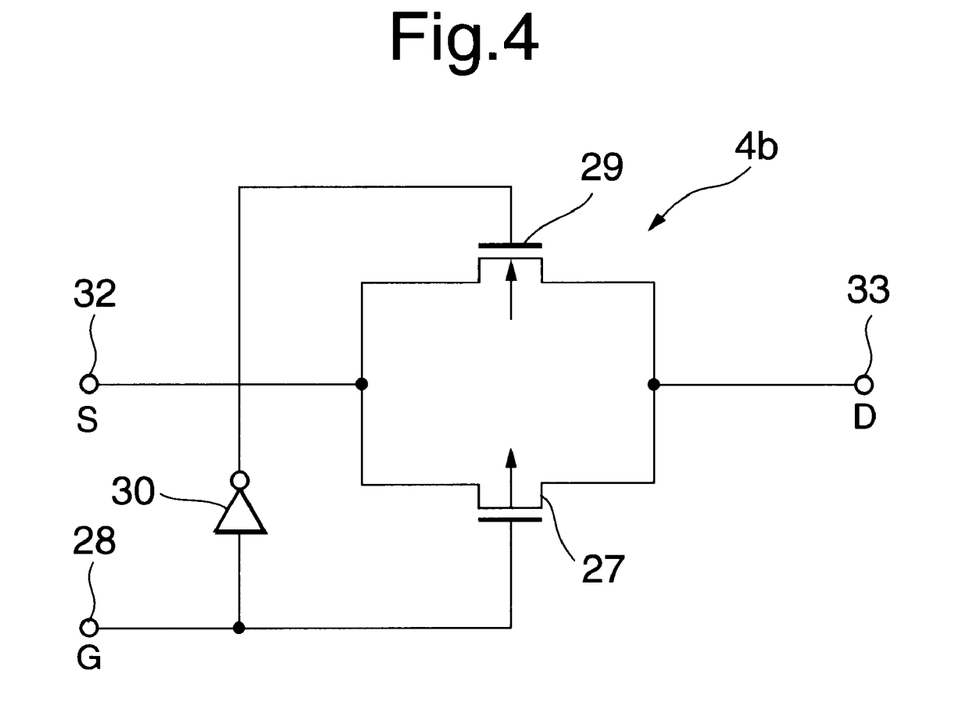
FIG. 4 represents a circuit arrangement of another transfer gate employed in the latch circuit of FIG. 1.

FIG. 4 shows an equivalent circuit diagram of the transfer gate 4b. This transfer gate 4b owns the substantially same circuit arrangement as that of the above-explained transfer gate 4a. This transfer gate 4b owns the following different point: That is, a gate electrode of a p-channel transistor 27 is directly connected to a gate terminal 28, and a gate electrode of an n-channel transistor 29 is connected via an inverter 30 to the gate terminal 28.

When a HI voltage ("HI" potential) is applied to the gate terminal 28, the source terminal 31 of the transfer gate 4b is electrically cut from the drain terminal 32 thereof (OFF state). When an LO voltage ("LO" potential) is applied to the gate electrode 28 of this transfer gate 4b, the source terminal 31 thereof is electrically connected to the drain terminal 32 thereof (ON state).

Figure 5:
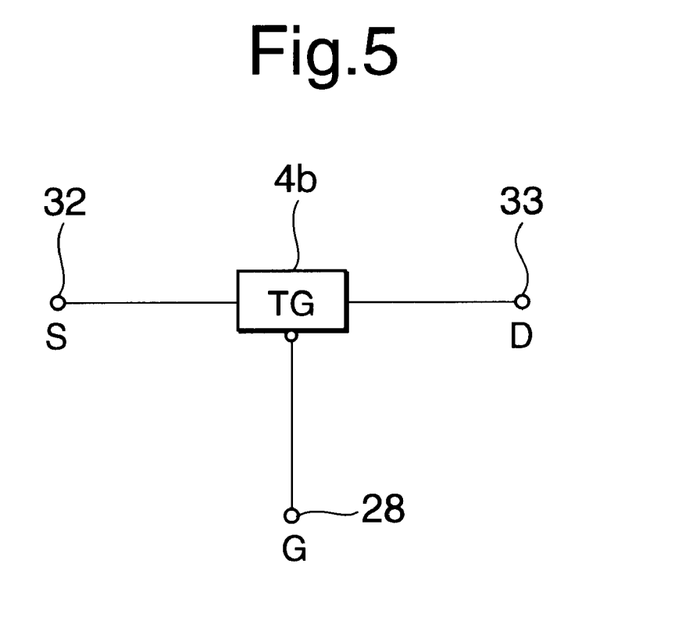
FIG. 5 is a diagram for explaining an indication symbol of the transfer gate shown in FIG. 4.

In this specification of the present invention, the transfer gate 4b shown in FIG. 4 is represented by employing a symbol shown in FIG. 5. In this symbol, lines connected to two short sides of a rectangle which surrounds a character of "TG" indicate either the source terminal or the drain terminal. Since the source terminal and the drain terminal are electrically equivalent to each other, no discrimination is made. A line connected to a small circle which is made in contact with one long side of this rectangle which surrounds the character of "TG" indicates a gate terminal.

Both the transfer gate 4a and the transfer gate 4b are operated in a complementary mode. As a result, the selection switch 4 connects any one of the input terminal N0 and the node N1 to the node N2 in response to the local clock signal "b". When the local clock signal "c" is a "HI" potential, this selection switch 4 connects the input terminal N0 to the node N2. When the local clock signal "c" is a "LO" potential, the selection switch 4 connects the node N1 to the node N2.

As indicated in FIG. 1, the node N2 to which the output of the selection switch 4 is connected is connected to an input of an inverter 5. The inverter 5 inverts the potential of the node N2 and then outputs the inverted potential to another node N3. It should be understood in this specification that an expression a certain element "inverts a potential" owns the following meanings: That is, when a potential at the input terminal of this element is equal to a "HI" potential, this element produces a "LO" potential, whereas when a potential at the input terminal of this element is equal to a "LO" potential, this element produces a "HI" potential. The node N3 holds negative logic data of the data held by the master flip-flop 2. The potential of the node N3 is outputted as a negative logic latch signal "e" to the slave flip-flop 3.

The node N3 is connected to an input of an inverter 6. The inverter 6 inverts the potential of the node N3, and then outputs the inverted potential to the node N1. The potential at the node N1 is outputted as a positive logic latch signal "f" to the slave flip-flop 3.

Both the negative logic latch signal "e" and the positive logic latch signal "f" are inputted to the slave flip-flop 3. Further, both the local clock signal "b" and the local clock signal "c" are inputted into this slave flip-flop 3. The slave flip-flop 3 is operated in response to the local clock signal "b" and the clock signal "c". In this case, the local clock signal "b" corresponds to such a signal produced by inverting the clock signal "a". As a result, the slave flip-flop 3 is operated in response to both the clock signal "a" and the clock signal "b".

The slave flip-flop 3 contains a selection switch 7. The input of the selection switch 7 is connected to both the node N3 contained in the master flip-flop 2 and a node N4 contained in the slave flip-flop 3. The negative logic latch signal "e" is inputted from the input connected to the node N3. On the other hand, a production stage of the potential at the node N4 will be explained later. The output of the selection switch 7 is connected to a node N5.

In response to the local clock signal "b", the selection switch 7 connects the node N5 to any one of the node N3 and the node N4. When the local clock signal "b" is a "HI" potential, the selection switch 7 connects both the node N4 and the node N5 to each other. In this case, the node N4 corresponds to such a node in which the negative logic data of the data held by the slave flip-flop 3 is held. At this time, the negative logic data of the data held by the slave flip-flop 3 is entered into the node N5. When the local clock signal "b" is a "LO" potential, the selection switch 7 connects both the node N3 and the node N5 to each other. At this time, the negative logic latch signal "e" is entered into the node N5.

The selection switch 7 is provided with both a transfer gate 7a and a transfer gate 7b. The transfer gate 7a is connected to the node N4. The transfer gate 7b is connected to the node N3. The transfer gate 7a owns the same function and also the same construction as those of the transfer gate 4a. The transfer gate 7b owns the same function and also the same construction as those of the transfer gate 4b. The selection switch 7 owns a similar structure and also a similar function as those of the selection switch 4.

The node N5 is connected to the input of an inverter 8. The inverter 8 inverts the potential of the node N5, and then outputs the inverted potential to a node N6. The node N6 constitutes such a node in which the positive logic data of the data held by the slave flip-flop 3 is held. The node N6 is connected to any one of the inputs of a selection switch 9. The other input of this selection switch 9 is connected to the node N1 of the master flip-flop 2. The output of the selection switch 9 is connected to a node N7.

In response to the clock signal "c", the selection switch 9 connects the node N7 to any one of the node N1 and the node N6. The clock signal "c" owns the same time period as that of the clock signal "a", and also has a phase shifted by "π" from the phase of this clock signal "a". When the clock signal "c" is a "HI" potential, the selection switch 9 connects the node N1 to the node N7. At this time, the positive logic latch signal "f" is inputted to the node N7. When the clock signal "c" is a "LO" potential, the selection switch 9 connects the node N6 to the node N7. At this time, the positive logic data of the data held by the slave flip-flop 3 is entered to the node N7.

The selection switch 9 is provided with both a transfer gate 9a and a transfer gate 9b. The transfer gate 9a is connected to the node N6. The transfer gate 9b is connected to the node N1. The transfer gate 9a owns the same function and also the same construction as those of the transfer gate 4a. The transfer gate 9b owns the same function and also the same construction as those of the transfer gate 4b. The selection switch 9 owns a similar structure and also a similar function as those of the selection switch 4.

The node N7 is connected to the input of an inverter 10. The inverter 10 inverts the potential of the node N7, and then outputs the inverted potential to the node N4.

A signal path is used to connect the node N4 with the node N6, through which a signal is transferred from the node N4 via the selection switch 7, and the inverter 8 to the node N6 in this order. While the signal is transferred via this path, the signal is inverted. Furthermore, another signal path is used to connect the node N4 with the node N6, through which a signal is transferred from the node N6 via the selection switch 9, and the inverter 10 to the node N4 in this order. While the signal is transferred via this path, the signal is inverted.

Also, the input of an output inverter 11 is connected to the node N5. The output inverter 11 inverts the potential of the node N5, and then outputs the inverted potential as an output signal "g." The negative logic data of the data held by the slave flip-flop 3 is held in this node N5. As a result, the data held by the slave flip-flop 3 is outputted as the output signal "g".

Next, operations of the semiconductor circuit according to the first embodiment of the present invention will be described. Referring now to a timing chart shown in FIG. 6, operations of the flip-flops will be explained. When a time instant "t" is equal to t<0, it is so assumed that signals having "LO" potentials are entered as the clock signal "a" and the clock signal "c". At this time, the local clock signal "b" is a "HI" potential. This is because this local clock signal "b" corresponds to such a signal produced by inverting the clock signal "a".

Figure 6:
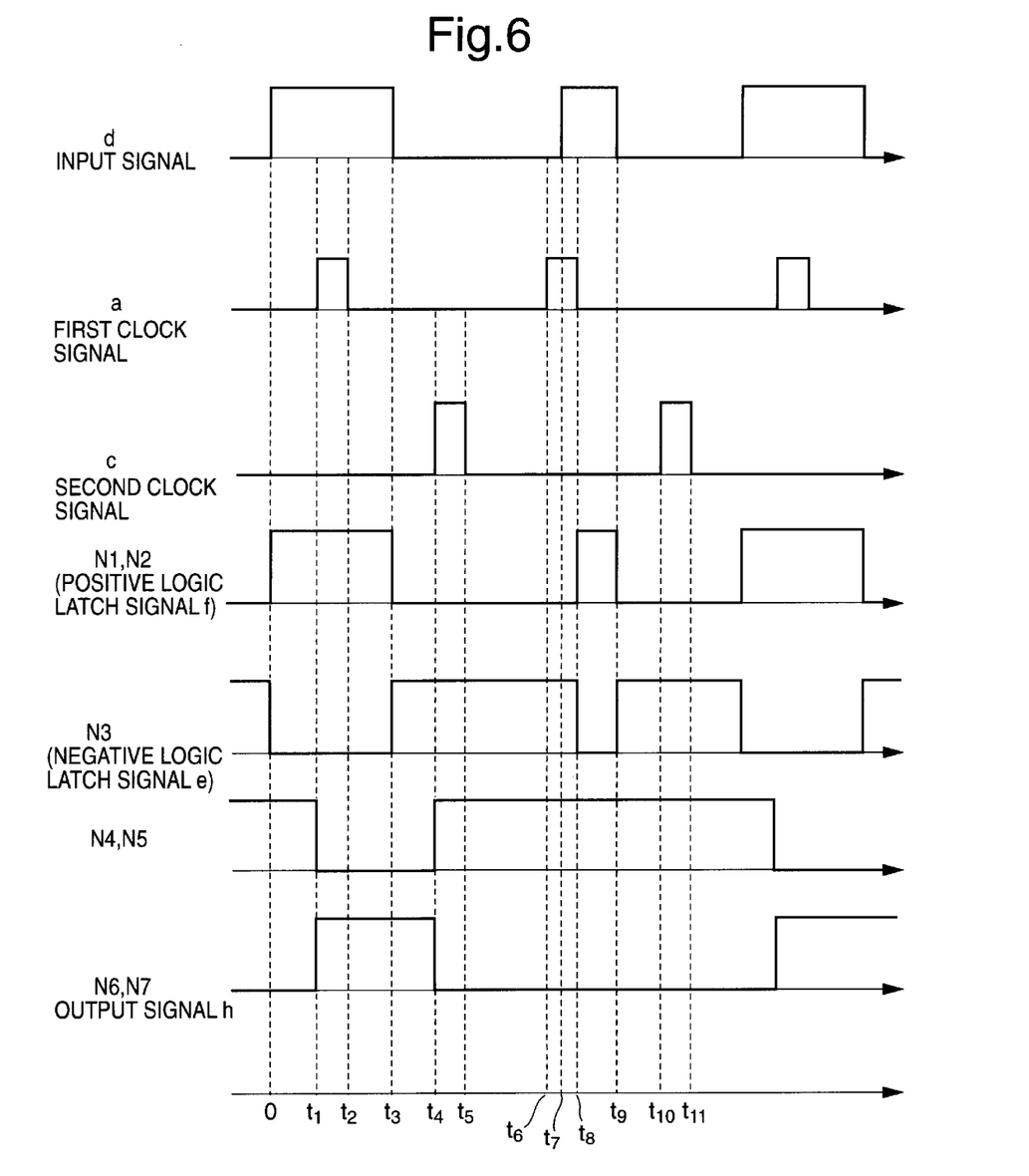
FIG. 6 is a timing chart for explaining operations of the data latch circuit according to the first embodiment.

Also, when the time instant "t" is equal to t<0, it is so assumed that the input signal "d" is a "LO" potential. At this time, a potential at the node N2 is a "LO" potential. This is because the input signal "d" is entered to the node N2. Also, a potential at the node N3 is a "HI" potential. This is because such a potential obtained by inverting the potential of the node N2 is outputted to the node N3. A potential at the node N1 is at a "LO" potential. This is because such a potential obtained by inverting the potential of the node N3 is outputted to the node N1.

Furthermore, it is so assumed that data having a "LO" potential is held by the slave flip-flop 3. In other words, it is so assumed that "LO" potentials are held by the node N6 and the node N7 of the slave flip-flop 3, whereas "HI" potentials are held by the node N4 and the node N5.

Time instant $0 \leq t < t1$

During time instant $0 \leq t < t1$, both the clock signal "a" and the second local clock signal "c" own "LO" potentials. The local clock signal "b" owns a "HI" potential. Therefore, the input terminal N0 is connected to the node N2. The input signal "d" is inputted to the node N2.

The potential of the input signal "d" is changed into a "HI" potential at a time instant "0". The input signal "d" is transferred from the node N2 via the inverter 5, the node 3, the inverter 6 to the node 1 in this order. The potential of this input signal "d" is inverted by the inverter 5 and the inverter 6. As a result, the potential of the node N1 and the potential of the node N4 are changed into "HI" potentials at the time instant t=0 in response to the input signal "d". Also, the potential of the positive logic latch signal "f" is changed into a "HI" potential. The potential at the node N3 is changed into a "LO" potential at the time instant t=0. This is because the potential at the node N3 is produced by inverting the potential at the node N2. Also, the potential of the negative logic latch signal "e" is changed into a "LO" potential.

On the other hand, in the slave flip-flop 3, the node N5 is connected to the node N4. The node N7 is connected to the node N6. In the slave flip-flop 3, such a closed loop is constituted, through which a signal is transferred from the node N4 via the node N5, the inverter 8, the node N6, the node N7, the inverter 10 to the node N4. The slave flip-flop 3 continuously holds such data which is held at the time instant t=0 by way of this closed loop. In other words, both the node N4 and the node N5 hold the "HI" potentials, and both the node N6 and the node N7 hold the "LO" potentials. The output signal "g" is produced by inverting the potential at the node N5. In other words, the output signal "g" continuously outputs the "LO" potential.

Time instant $t1 \leq t < t2$

At a time instant "t1", the potential of the clock signal "a" is changed from a "LO" potential to a "HI" potential. The potential of the local clock signal "b" becomes a "LO" potential.

The node N2 of the master flip-flop 2 is cut off from the input signal "d", and is connected to the node N1. In the master flip-flop 2, such a closed loop is constituted, through which a signal is transferred from the node N2 via the inverter 5, the node N3, the inverter 6, the node N1 to the node N2. The master flip-flop 2 holds such data of the input signal "d" at the time instant "t1" by way of this closed loop. In other words, both the node N1 and the node N2 continue to hold the "HI" potentials, and the node N3 continues to hold the "LO" potential. The positive logic latch signal "f" maintains a "HI" potential state, and the negative logic latch signal "e" maintains a "LO" potential state.

On the other hand, the node N5 of the slave flip-flop 3 is connected to the node N3 of the master flip-flop 2. The negative logic latch signal "e" at the time instant "t1" is fetched into the slave flip-flop 3. The negative logic latch signal "e" is transferred from the node N5 via the inverter 8, the node N6, the node N7, the inverter 10 to the node N4 in this order. The potentials of the node N4 and the node N5 become "LO" potentials, whereas the potentials of the node N6 and the node N7 become "HI" potentials.

The slave flip-flop 3 outputs the negative logic data of the node N5 as the output signal "g". In other words, the slave flip-flop 3 outputs a "HI" potential as the output signal "g". In this manner, when the local clock signal "d" rises, the flip-flop 1 latches the data of the input signal "d", and then outputs the latched data as the output signal "g".

Time instant $t2 \leq t < t4$

At a time instant "t2", the potential of the clock signal "a" is returned to a "LO" potential. The potentials of both the clock signal "a" and the clock signal "c" are "LO" potentials. The potential of the local clock signal "b" is a "HI" potential.

The node N2 of the master flip-flop 2 is connected to the input terminal N0. The input signal "d" is inputted to the node N2. This input signal "d" is transferred from the node N2 via the inverter 5, the node N3, the inverter 6 to the node N1 in this order.

At a time instant "t3" which is defined by t2<t3<t4, the potential of the input signal "d" is changed into the "LO" potential. In response to the input signal "d", the potentials of the node N1 and the node N2 are changed into "LO" potentials at this time instant "t3". At the time instant "t3", the potential of the node N3 is changed into the "HI" potential.

On the other hand, in the slave flip-flop 3, such a closed loop is constituted, through which the signal is transferred from the node N4 via the node N5, the inverter 8, the node N6, the node N7, the inverter 10 to the node N4 in this order. The slave flip-flop 3 does not fetch both the positive logic latch signal "f" and the negative logic latch signal "e". The slave flip-flop 3 continuously holds such data which has been held at t=t2 by way of this closed loop. In other words, after the potential of the input signal "d" has been changed to the "LO" potential at the time instant "t3", both the node N4 and the node N5 maintain the "LO" potentials, and also both the node N6 and the node N7 maintain the "HI" potentials.

Time instant t4≦t<t5

At a time instant "t4", the potential of the clock signal "c" is changed into a "HI" potential. The potential of the clock signal "a" remains at a "LO" potential. The local clock signal "b" maintains the condition of the "HI" potential. The input signal "e" is transferred from the node N2 via the inverter 5, the node N3, the inverter 6 to the node N1 in this order. Since the input signal "e" maintains the "LO" potential state, both the node N1 and the node N2 maintain the "LO" potential state whereas the node N3 maintains the "HI" potential state. The positive logic latch signal "f" maintains the "LO" potential state, and the negative logic latch signal "e" maintains the "HI" potential state.

The slave flip-flop 3 fetches the positive logic latch signal "f". The positive logic latch signal "f" is transferred from the node N7 via the inverter 10, the node 4, the node 5, the inverter 8 to the node N6 in this order. The potentials of both the node N6 and the node N7 are changed into "LO" potentials in response to the positive logic latch signal "f". The potentials of both the node N4 and the node N5 are changed into "HI" potentials. The potential of the output signal "g" is changed into a "LO" potential. As a result, the flip-flop 1 latches the input signal "d" in response to the testing local clock signal "f", and then outputs this latched input signal "d" as the output signal "g".

It should be noted that at the time instant t4<t<t5, when the state of the input signal "d" is changed, the data fetched by the slave flip-flop 3 is also changed. This is because the input signal "d" is continuously supplied to the slave flip-flop 3 via the positive logic latch signal "f". In order to operate the flip-flop 1 under normal condition, the following condition is required. That is, when the potential of the clock signal "c" becomes the "HI" potential, the potential of the input signal "d" is not changed.

Time instant t5≦t<t8

At a time instant "t5", the potential of the clock signal "a" is returned to a "LO" potential. Subsequently, at a time instant "t6" which is defined by t5<t6<t8, the potential of the clock signal "a" is changed to a "HI" potential. The potential of the clock signal "a" maintains the "HI" potential during a time period defined by t6<t<t8.

The node N2 of the master flip-flop 2 is cut off from the input signal "d", and is connected to the node N1. In the master flip-flop 2, such a closed loop is constituted, through which a signal is transferred from the node N2 via the inverter 5, the node N3, the inverter 6, the node N1 to the node N2. The master flip-flop 2 continuously holds such data which is held at the time instant "t6" by way of this closed loop. In other words, both the node N1 and the node N2 continuously hold the "LO" potentials, and the node N3 continuously holds the "HI" potential. The positive logic latch signal "f" maintains the "LO" potential state, and the negative logic latch signal "e" maintains the "HI" potential state.

At a time instant "t7" defined by t6<t7<t8, the potential of the input signal "d" is changed into a "HI" potential. However, the master flip-flop 2 does not fetch the input signal "d" during a time period defined by t6<t<t8. At the time instant "t7" defined by t6<t7<t8, even when the potential of the input signal "d" is changed into a "HI" potential, the potentials of both the positive logic latch signal "f" and the negative logic latch signal "e" are not changed.

On the other hand, the slave flip-flop 3 fetches the negative logic latch signal "e" for a time duration during which the local clock signal "d" is maintained at the "HI" potential. Within the time period defined by t6<t<t8, the potential of the negative logic latch signal "e" becomes the "HI" potential. At this time, both the potential of the node N4 and the potential of the node N5 are the "HI" potentials. The potentials of both the node N6 and the node N7 are equal to the "LO" potentials. The output signal "g" maintains the "LO" potential. As a result, the flip-flop 1 latches the data of the input signal "d" at such a time instant "t6" when the potential of the clock signal "a" is changed into the "HI" potential, and then outputs this latched data as the output signal "g".

Even when the potential of the input signal "d" is changed while the potential of the clock signal "a" is equal to the "HI" potential, this flip-flop 1 latches such data obtained when the potential of the clock signal "a" is changed into the "HI" potential, and then outputs the latched data as the output "g".

As previously explained, in such a case that the potential of any one of the clock signal "a" and the clock signal "c" is changed into the "HI" potential, the data latch circuit, according to the first embodiment of the present invention, latches the data of the input signal "d" and holds this latched input signal. This data latch circuit may latch the data of the input signal "d" without using the NOR gate, in response to such a signal produced by OR-gating the clock signal "a" and the clock signal "c".

The data latch circuit according to the first embodiment does not use such a NOR gate having a large capacity of an input terminal thereof. Either the inverter or the transfer gate is connected to the signal line through which the clock signal is transferred. The input gate capacity of the inverter is equal to 60 percent of the input gate capacity of the NOR gate. Also, the input gate capacity of the transfer gate is smaller than the input capacity of the NOR gate. In accordance with the data latch circuit of the first embodiment, the capacity connected to the signal line through which the clock signal is transferred can be made smaller than that of the conventional data latch circuit. Since the capacity connected to the signal line through which the clock signal is transferred is reduced, the data latch circuit of the first embodiment can be operated at high speed.

Figure 7:
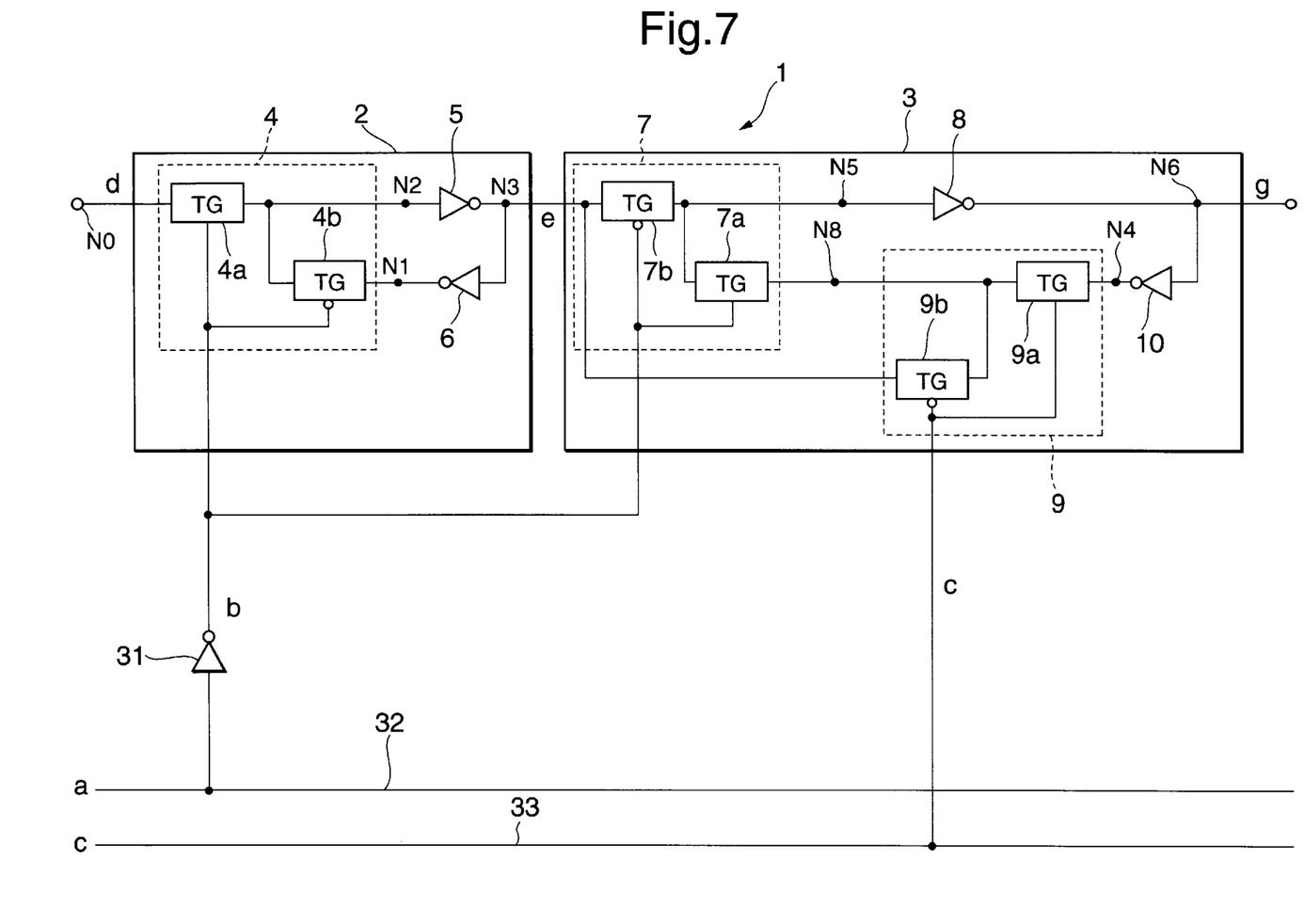
FIG. 7 is a schematic block diagram for indicating a circuit arrangement of the data latch circuit according to the second embodiment.

FIG. 7 shows a data latch circuit according to a second embodiment of the present invention.

The data latch circuit shown in FIG. 7 is arranged by employing such a structure that both the selection switch 7 and the selection switch 9 are provided in series on the signal path through which the signal is transferred from the node N4 to the node N6. In this alternative arrangement, the negative logic latch signal "e" is inputted to the input of the selection switch 9 instead of the positive logic latch signal "f".

Figure 8:
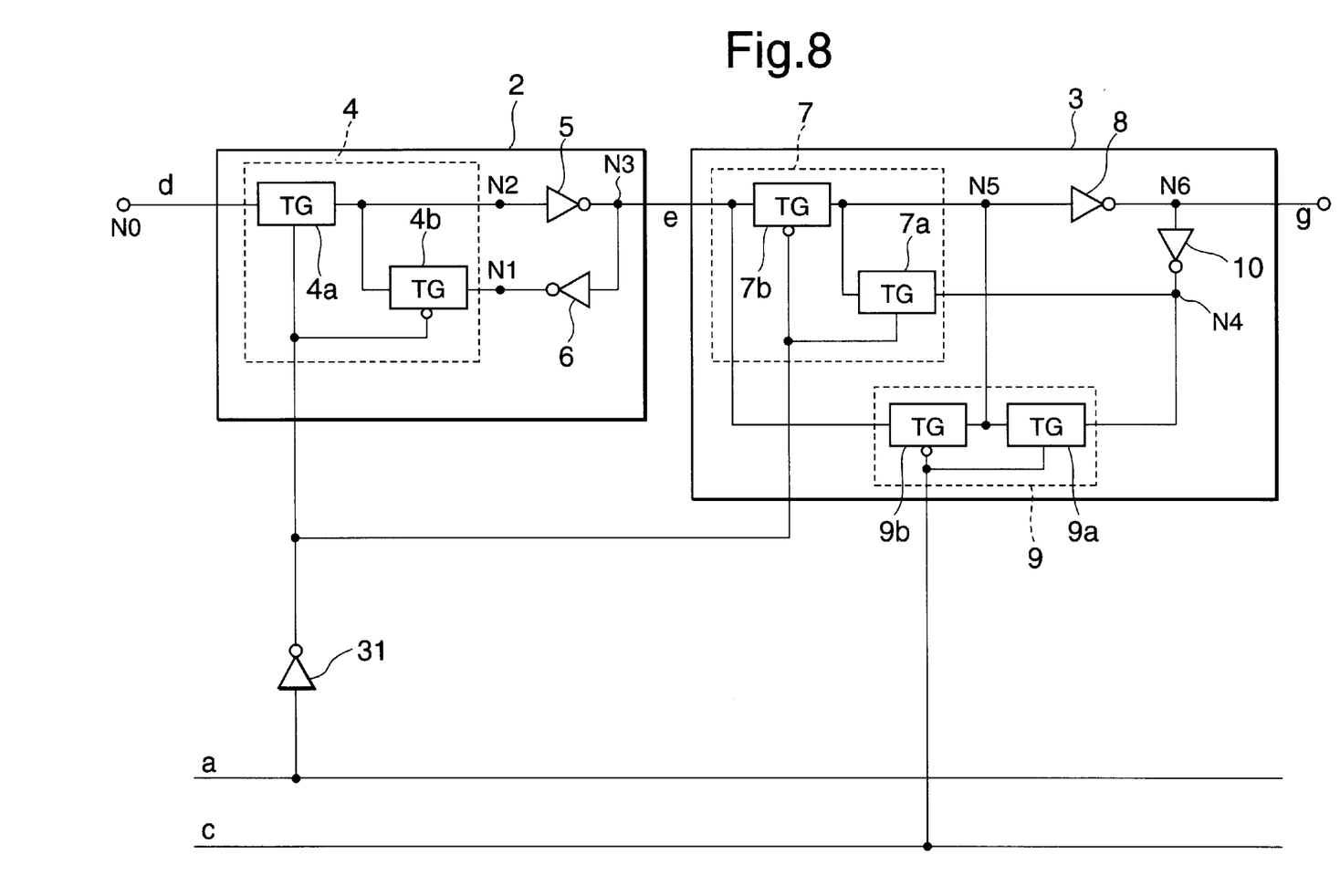
FIG. 8 is a schematic block diagram for indicating a circuit arrangement of the data latch circuit according to the third embodiment.

FIG. 8 shows a data latch circuit according to a third embodiment of the present invention.

The data latch circuit shown in FIG. 8 is arranged by employing such a structure that both the selection switch 7 and the selection switch 9 are provided in a parallel manner on the signal path through which the signal is transferred from the node N4 to the node N6. In this alternative arrangement, the negative logic latch signal "e" is inputted to the input of the selection switches 7 and 9 instead of the positive logic latch signal "f" in such a case that both the selection switch 7 and the selection switch 9 are present between the inverter 8 and the node N4. In the case that both the selection switch 7 and the selection switch 9 are present between the inverter 8 and the node N6, the positive logic latch signal "f" is inputted to the inputs of the selection switch 7 and the selection switch 9.

In addition, the data latch circuit is arranged by employing such a structure that both the selection switch 7 and the selection switch 9 are provided on the signal path through which the signal is transferred from the node N6 to the node N4. In this alternative arrangement, the positive logic latch signal "f" is inputted to the input of the selection switch 7 instead of the negative logic latch signal "e".

It should be understood that the data latch circuit shown in FIG. 1 owns such merits as the high-speed operations, as compared with the data latch circuits indicated in FIG. 7 and FIG. 8. The semiconductor circuit shown in FIG. 1 owns such an arrangement that both the negative logic latch signal "e" and the positive logic latch signal "f" are fetched by the slave flip-flop 3. The load is distributed to both the negative logic latch signal "e" and the positive logic signal "f". Since the load is distributed, only one of the load given to either the negative logic latch signal "e" or the positive logic latch signal "f" is not increased, so that this semiconductor circuit can own the merit as the high-speed operation.

Also, in the data latch circuit according to the first to third embodiments, the slave flip-flop 3 may be modified to input other clock signals. At this alternative arrangement, a plurality of selection switches may be employed, the total number of which is selected to be equal to a total number of clock signals which are inputted to the slave flip-flop 3. When other selection switches are provided between the output terminal of the inverter 10 and the input terminal of the inverter 8, the negative logic latch signal "e" is entered. When other selection switches are provided between the output terminal of the inverter 8 and the input terminal of the inverter 10, the positive logic latch signal "f" is entered.

In the case that other clock signals are further entered into the slave flip-flop 3, the clock signal "a", the clock signal "c", and other clock signals own the same frequencies, and own different phases from each other. Assuming now that the phase of the clock signal "a" is set to "0" and a total number of the clock signal "c" and other clock signals is selected to be "n" (symbol "n" being a natural number), the phases of the clock signal "c" and other clock signals may be preferably selected to be any one of $2\pi i/(n+1)$ (symbol "i" being a natural number from 0 to m). In this case, the flip-flop 1 operates at such an operation speed equivalent to the operation speed realized when a clock signal having a frequency n-times higher than the frequency of the clock signal "a" is inputted.

Figure 9:
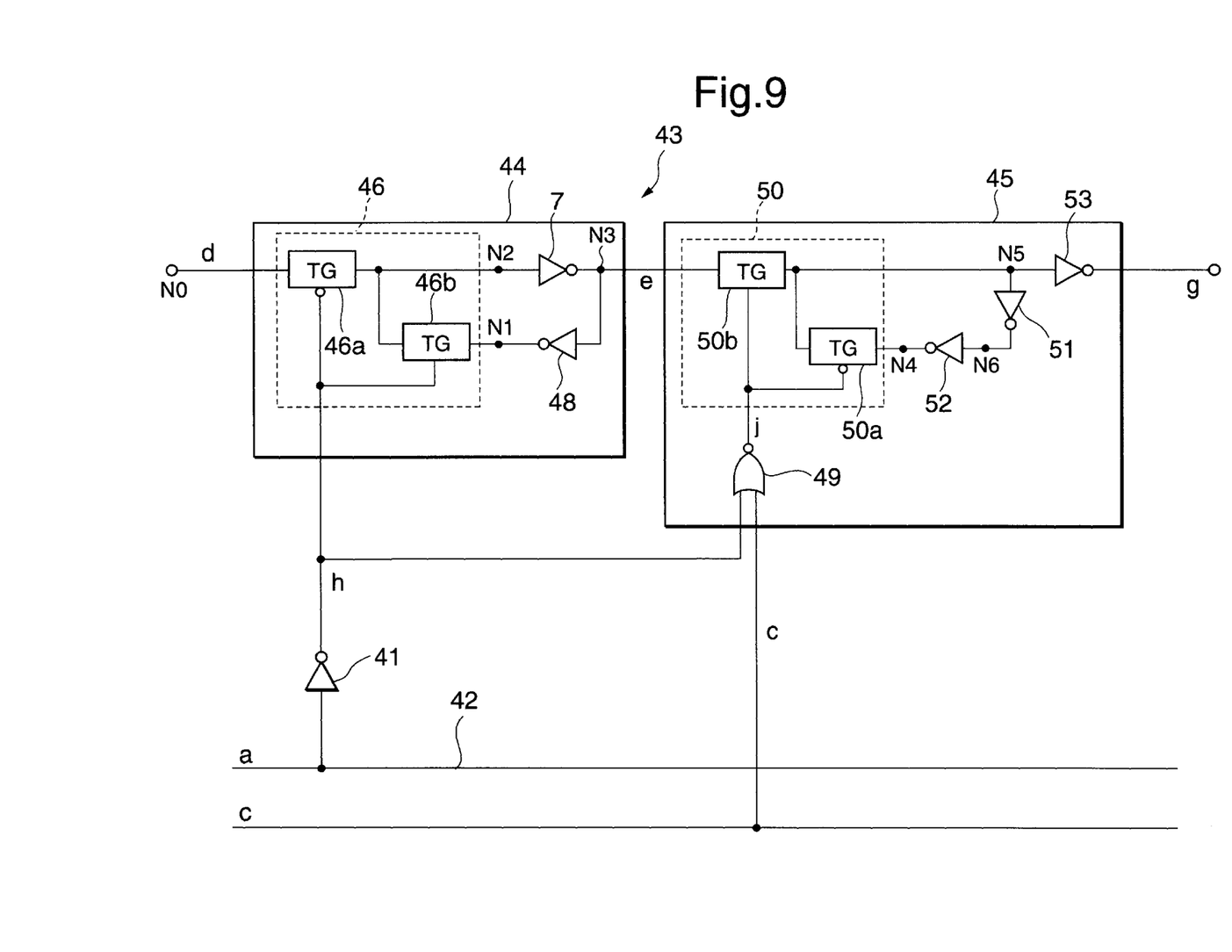
FIG. 9 is a schematic block diagram for representing a circuit arrangement of a data latch circuit according to a fourth embodiment of the present invention.

FIG. 9 shows a data latch circuit according to a fourth embodiment of the present invention. The data latch circuit of the fourth embodiment is provided with a buffer and a flip-flop. A clock signal "a" is inputted via a first clock signal line 42 to this buffer 41. The buffer 41 is formed by connecting an inverter in series to this buffer 41. The waveform of this clock signal "a" is deformed while this clock signal is transferred via the first clock signal line 42. The buffer 41 reproduces a waveform of the clock signal "a". The buffer 41 outputs such a signal essentially identical to the clock signal "a" as a first local clock signal "h".

The first local clock signal "h" is inputted to the flip-flop 43. The flip-flop 43 contains both a master flip-flop 44 and a slave flip-flop 45. In response to the first local clock signal "h", the master flip-flop 44 latches an input signal "d", and then holds the latched data. The master flip-flop 44 outputs negative logic data of the held data as a negative logic latch signal "e".

Both the first local clock signal "h" and a second clock signal "c" are inputted into the slave flip-flop 45. The slave flip-flop 45 latches the negative logic latch signal "e" in response to an OR-gated signal between the first local clock signal "h" and the second clock signal "c". The slave flip-flop 45 holds the latched data. The slave flip-flop 45 outputs the held data as an output signal "g".

The master flip-flop 44 contains a selection switch 46. Both an input terminal N0 and a node N1 are connected to the input of the selection switch 46. The node N0 corresponds to such a node into which an input signal "d" is entered. The node N1 corresponds to such a node which holds positive logic data of data held by the master flip-flop 44. A producing stage of a potential at the node N1 will be explained later.

The selection switch 46 contains both a transfer gate 46a and another transfer gate 46b. The transfer gate 46a is connected to the input terminal N0. This transfer gate 46a is brought into an ON state when the first local clock signal "b" owns the "LO" potential. At this time, the input terminal N0 is connected to a node N2. The transfer gate 46b is brought into an OFF state when the first local clock signal "h" owns the "HI" potential. At this time, the input terminal N0 is not connected to the node N2. The transfer gate 46a has a similar structure to that of the transfer gate 4b.

The transfer gate 46b is connected to the node N1. This transfer gate 46b is brought into an OFF state when the first local clock signal "h" owns the "LO" potential. At this time, the node N1 is not connected to the node N2. The transfer gate 46b is brought into an ON state when the local clock signal "b" owns the "HI" potential. At this time, the node N1 is connected to the node N2. The transfer gate 46b owns a similar structure to that of the transfer gate 4a.

The node N2 is connected to an input of an inverter 47. The inverter 47 inverts the potential of the node N2, and then outputs the inverted potential to the node N3. The node N3 holds the negative logic data of the data held by the master flip-flop 44. The potential at the node N3 is outputted as a negative logic latch signal "e" to the slave flip-flop 45. The node N3 is connected to the input of the inverter 48. The inverter 48 inverts the potential at the node N3, and then outputs the inverted potential to the node N1.

The slave flip-flop 45 contains a NOR gate 49. The NOR gate 49 NOR-gates the first local clock signal "h" and the second clock signal "c", and then outputs the NOR-gated signal as a second local clock signal "j".

The slave flip-flop 45 further contains a selection switch 50. The input of the selection switch 50 is connected to both the node N3 contained in the master flip-flop 44 and the node N4 contained in the slave flip-flop 45. The negative logic latch signal "e" is inputted from the input connected to the node N3. On the other hand, a production stage of the potential at the node N4 will be explained later. The output of the selection switch 48 is connected to the node N5.

In response to the second local clock signal "j", the selection switch 50 connects the node N5 to any one of the node N3 and the node N4. When the second local clock signal "j" becomes a "HI" potential, the selection switch 50 connects both the node N4 and the node N5 to each other. In this case, the node N4 corresponds to such a node in which the negative logic data of the data held by the slave flip-flop 45 is held. At this time, the negative logic data of the data held by the slave flip-flop 45 is entered. When the second local clock signal "j" becomes a "LO" potential, the selection switch 50 connects both the node N3 and the node N5 to each other. At this time, the negative logic latch signal "e" is entered into the node N5.

The selection switch 50 is provided with both a transfer gate 50a and a transfer gate 50b. The transfer gate 50a is connected to the node N4. The transfer gate 50*b* is connected to the node N3. The transfer gate 50*a* owns the same function and also the same construction as those of the transfer gate 4*b*. The transfer gate 50*b* owns the same function and also the same construction as those of the transfer gate 4*a*. The selection switch 50 owns a similar structure and also a similar function as those of the selection switch 4.

The node N5 is connected to an input of an inverter 51. The inverter 51 inverts the potential of the node N5, and then outputs the inverted potential to the node N6. The node N6 constitutes such a node in which the positive logic data of the data held by the slave flip-flop 45 is held.

The node N6 is connected to an input of an inverter 52. The inverter 52 inverts the potential of the node N6, and then outputs the inverted potential to the node N4.

Also, an input of an output inverter 53 is connected to the node N5. The output inverter 53 inverts the potential of the node N5, and then outputs the inverted potential as an output signal "g". The negative logic data of the data held by the slave flip-flop 45 is held in this node N5. As a result, the data held by the slave flip-flop 45 is outputted as the output signal "g".

The operations of the data latch circuit according to the fourth embodiment are substantially identical to those of the data latch circuit according to the first to third embodiments. In such a case that the first clock signal "a", the second clock signal "c", and the input signal "d", which own the waveforms shown in FIG. 6 are entered into the data latch circuit of the fourth embodiment, the waveform of the output signal "g" is identical to that of the data latch circuit of the first to third embodiments.

In the data latch circuit of the fourth embodiment, the element driven by the NOR gate 49 is only the selection switch 50. As a result, the maximum drive-ability of the used NOR gate can be reduced, as compared with that of the conventional data latch circuit. As a result, the data latch circuit of the second embodiment can have the merit of the high-speed operation.

Figure 10:
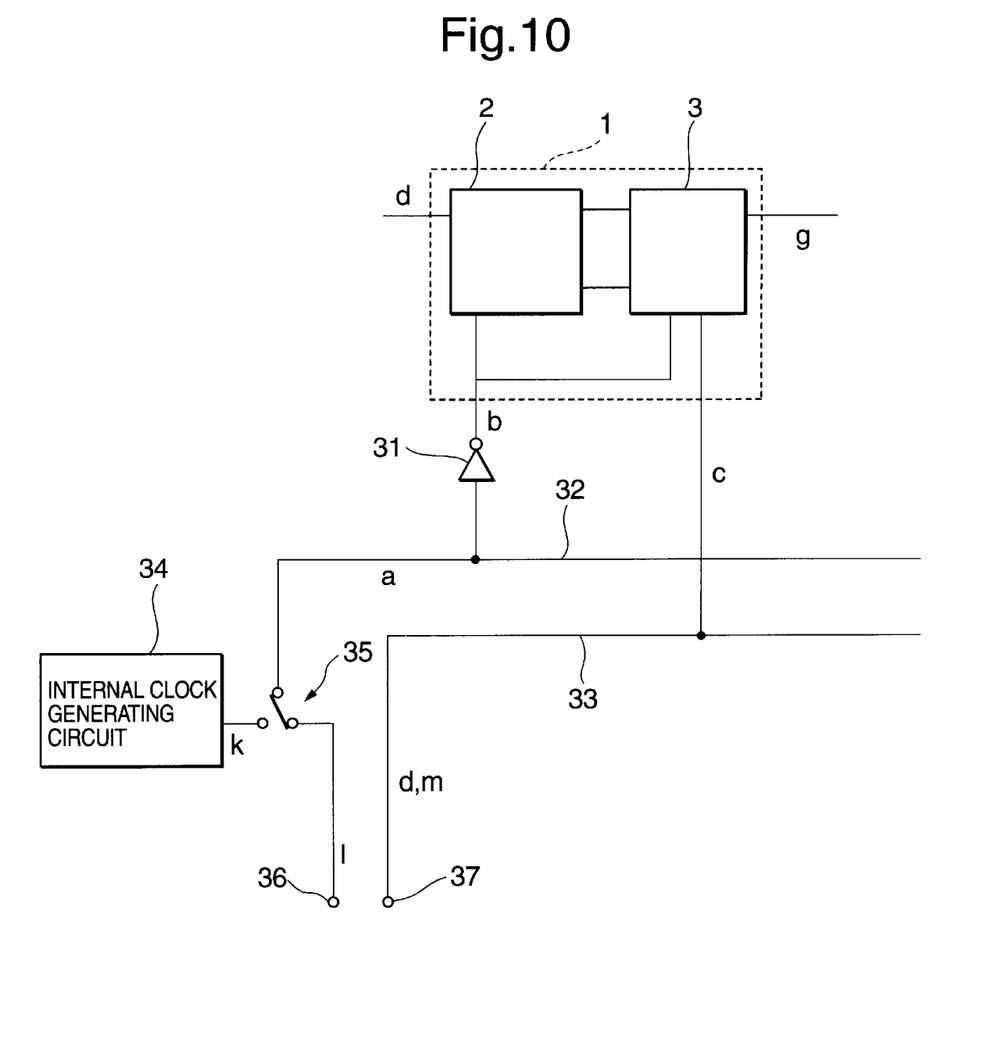
FIG. 10 is a schematic block diagram for representing a circuit arrangement of a data latch circuit according to a fifth embodiment of the present invention.

FIG. 10 shows a data latch circuit according to a fifth embodiment of the present invention. The data latch circuit shown in FIG. 10 is arranged by adding several circuit elements to the data latch circuit of the first to third embodiments.

The data latch circuit according to the fifth embodiment is provided with an internal clock generating circuit and a first terminal, and also a second terminal. As indicated in FIG. 10, this internal clock generating circuit 34 outputs an internal clock signal "k" to a switch 35. A first external clock signal "l" is inputted to the first terminal 36. The first terminal 36 is connected to the switch 35. The switch 35 outputs any one of the internal clock signals "k" and the first external clock signal "l" as a clock signal "a". The clock signal "a" is inputted via a first clock signal line 32 to an inverter 31. The inverter 31 outputs the clock signal "a" to a flip-flop 1.

A second external clock signal "m" is inputted to a second terminal 38. The second external clock signal "m" becomes a clock signal "c". The clock signal "c" is entered via a second clock signal line 33 to the flip-flop 1. This flip-flop 1 contains both a master flip-flop 2 and a slave flip-flop 3. The flip-flop 1 owns the same circuit arrangement as that of the data latch circuit according to the first to third embodiments, and is operated in a similar manner to that of the first to third embodiments.

The operations of the data latch circuit according to the fifth embodiment will now be described. In the data latch circuit of the fifth embodiment, two different modes, a test mode and the normal operation mode are selectively switched. The test mode corresponds to such an operation mode that the data latch circuit is tested by a tester. The normal operation mode implies such an operation mode that a semiconductor device containing the data latch circuit of the third embodiment is independently operated.

First, operations of this data latch circuit in the test mode will now be explained. At this time, the switch 35 is set in such a manner that the first clock signal line 32 is connected to the first terminal 36. The first external clock signal "l" is entered from a tester (not shown) to the first terminal 36. The second external clock signal "m" is entered from the tester to the second terminal 37. Both the first external clock signal "l" and the second external clock signal "m" own the same frequencies, and also have phases different from each other by "π". The switch 35 connects the first clock signal line 32 to the first terminal 36. The clock signal "a" becomes the first external clock signal "l". The clock signal "c" becomes the second external clock signal "m".

The clock signal "a" is inverted by the inverter 31, and then the inverted clock signal is entered as the local clock signal "b" into the flip-flop 1. Furthermore, the clock signal "c" is inputted into this flip-flop 1. The flip-flop 1 performs the latching operation in response to the OR-gated result between the clock signal "a" and the clock signal "c". Since both the first external clock signal "l" and the second external clock signal "m" own the same frequencies and also the different phases from each other by "π", the flip-flop 1 may be driven at a frequency two times the frequency of either the first external clock signal "l" or the second external clock signal "m".

Next, operations of this data latch circuit in the normal operation mode will now be explained. At this time, the switch 35 is set in such a manner that the first clock signal line 32 is connected to the internal clock generating circuit 34. The clock signal "a" becomes the internal clock signal "k". On the other hand, the potential of the second clock signal line 33 is maintained at a "LO" potential. The potential of the clock signal "c" is fixed to the "LO" potential. The flip-flop 1 performs the latching operation in response to the OR-gated result obtained between the clock signal "a" and the clock signal "c". As a result, the flip-flop 1 may be driven at the frequency of the internal clock signal "k".

Similar to the data latch circuit of the first to third embodiments, the data latch circuit of the fifth embodiment, can reduce the capacity of the first clock signal line 32. As a consequence, in the case that the data latch circuit of the fifth embodiment is operated in the normal operation mode, the high-speed operation of this data latch circuit can be realized. In addition, since the test mode is employed, even when the frequency of the clock signal supplied from the tester is low, the data latch circuit of the fifth embodiment can be driven in such a high-speed operation similar to when the clock signal is supplied with high frequency. As explained above, while the data latch circuit of the third embodiment is equipped with the test mode, this data latch circuit may be driven in the high-speed operation in the normal operation mode.

Also, similar to the first to third embodiments, the data latch circuit of the fifth embodiment may be alternatively arranged in such a manner that other external clock signals are inputted to the slave flip-flop 45. In such a case that other external clock signals are entered to the slave flip-flop 45, the first external clock signal "l", the second external clock signal "m", and also other external clock signals own the same frequencies, but own different phases from each other. Assuming now that the phase of the first external clock signal "l" is set to "0" and a total number of the second external clock signal "m" and other external clock signals is selected to be "n" (symbol "n" being a natural number), the phases of the second clock signal "m" and other clock signals may be preferably selected to be any one of $2\pi i/(n+1)$ (symbol "i" being a natural number from 0 to m). In this case, the flip-flop 1 operates at such an operation speed equivalent to the operation speed realized when a clock signal having a frequency n-times higher than the frequency of the clock signal "a".

As previously described in detail, in accordance with the data latch circuit of the present invention, the semiconductor circuit capable of latching the data in response to a plurality of clock signals can be provided, while the capacity of the signal line used to supply the clock signal can be further reduced. Furthermore, in accordance with the data latch circuit of the present invention, the semiconductor circuit capable of latching the data in response to a plurality of clock signals can be provided, while the maximum driveability of the logic gates under use can be reduced.

More specifically, there is a specific merit in that the data latch circuit according to this embodiment is used as the data latch circuit operated by switching the normal operation mode and the test mode. In accordance with the data latch circuit of the present invention, the capacity of the signal line can be reduced. As a result, even when the clock signal having the higher frequency (for example, 200 MHz) is supplied to the data latch circuit of the present invention operable in the normal operation mode, the delay time of the clock signal can be shortened. Also, the rising waveform of the clock signal can be made sharp. As a result, it is possible to avoid the erroneous operation of the data latch circuit. As previously explained, even when the n-multiplication circuit is built in the data latch circuit of the present invention, this data latch circuit can execute the test operation of n-time high speed in the test mode without giving adverse influence on the operation in the normal operation mode.

What is claimed is:

1. A data latch circuit, comprising:
   a master flip-flop which responds to a first clock signal to fetch a first signal, hold said first signal as binary data and output first data as a second signal;
   a slave flip-flop which responds to at least one of said first clock signal and a second clock signal, to fetch said second signal, hold second data corresponding to said second signal, and also output a third signal corresponding to said second data;
   an internal clock generating circuit for generating a third clock signal;
   a first terminal to which a first external clock signal is supplied;
   a second terminal to which a second external clock signal is supplied; and
   a switch; and wherein said switch is connected to both said internal clock generating circuit and said first terminal, and outputs any one of said third clock signal and said first external clock signal as said first clock signal; and
   said second terminal outputs said second external clock signal as a second clock signal.

2. A data latch circuit, comprising:
   a master flip-flop which responds to a first clock signal to fetch a first signal, hold said first signal as binary data and output first data as a second signal;
   a slave flip-flop which responds to at least one of said first clock signal and a second clock signal, to fetch said second signal, hold second data corresponding to said second signal, and also output a third signal corresponding to said second data;
   wherein said slave flip-flop includes:
      a first node receiving said second data as a voltage;
      a second node receiving complementary data of said second data as a voltage;
      an inverter connected between said first node and said second node;
      a first switch outputting said second signal to said first node in response to said first clock signal; and
      a second switch outputting said second signal from said second node in response to said second clock signal;
   wherein said master flip-flop includes:
      a first node receiving said first data; and
      a second node receiving complementary data of said first data;
   wherein said first switch connects said first node of said master flip-flop to said first node of said slave flip-flop in response to said first clock signal and said second switch connects said first node of said master flip-flop to said first node of said slave flip-flop in response to said second clock signal.

3. A data latch circuit, comprising:
   an input node receiving an input signal;
   a master flip-flop which transfers said input signal to a first node when a first clock signal is in a first state and holds a voltage level of said input signal at said first node when said first clock signal is in a second state; and
   a slave flip-flop which transfers the held voltage level to a second node when said first clock signal is in a second state;
   said slave flip-flop holding a voltage at said second node in response to a second clock signal indicating a first mode when said first clock signal is in said first state;
   said slave flip-flop setting a voltage level at said first node to said second node in response to a second clock signal indicating a second mode when said first clock signal is in said first state;
   wherein said master flip-flop includes:
      a first transfer gate of a first type coupled to said input node;
      a first inverter coupled between said first transfer gate and said first node;
      a second inverter coupled to said first node; and
      a second transfer gate of a second type coupled to said second inverter and said first transfer gate;
      said first and second transfer gates receiving said first clock signal;
   wherein said slave flip-flop includes:
      a third transfer gate of said second type coupled between said first node and said second node;
      a third inverter coupled to said third transfer gate;
      a fourth transfer gate of said first type coupled between said third inverter and a third node;
      a fifth transfer gate of said second type coupled between a connecting point of said second transfer gate and said second inverter and said third node;
      a fourth inverter coupled to said third node; and
      a sixth transfer gate of said first type coupled between said fourth inverter and said third transfer gate;

said third and sixth transfer gates receiving said first clock signal;

said fourth and fifth transfer gates receiving said second clock signal.

4. A data latch circuit, comprising:

an input node receiving an input signal;

a master flip-flop which transfers said input signal to a first node when a first clock signal is in a first state and holds a voltage level of said input signal at said first node when said first clock signal is in a second state; and a slave flip-flop which transfers the held voltage level to a second node when said first clock signal is in a second state;

said slave flip-flop holding a voltage at said second node in response to a second clock signal indicating a first mode when said first clock signal is in said first state;

said slave flip-flop setting a voltage level at said first node to said second node in response to a second clock signal indicating a second mode when said first clock signal is in said first state;

wherein said master flip-flop includes:

a first transfer gate of a first type coupled to said input node;

a first inverter coupled between said first transfer gate and said first node;

a second inverter coupled to said first node; and a second transfer gate of a second type coupled to said second inverter and said first transfer gate;

said first and second transfer gates receiving said first clock signal;

wherein said slave flip-flop includes:

a third transfer gate of said second type coupled to said first node;

a third inverter coupled between said third transfer gate and said second node;

a fourth inverter coupled to said second node;

a fourth transfer gate of said first type coupled between said fourth inverter and said a third node; and a fifth transfer gate of said second type coupled between said first node and said third node; and a sixth transfer gate of said first type coupled between said third node and said third transfer gate;

said third and sixth transfer gates receiving said first clock signal;

said fourth and fifth transfer gates receiving said second clock signal.

5. A data latch circuit, comprising:

an input node receiving an input signal;

a master flip-flop which transfers said input signal to a first node when a first clock signal is in a first state and holds a voltage level of said input signal at said first node when said first clock signal is in a second state; and a slave flip-flop which transfers the held voltage level to a second node when said first clock signal is in a second state;

said slave flip-flop holding a voltage at said second node in response to a second clock signal indicating a first mode when said first clock signal is in said first state;

said slave flip-flop setting a voltage level at said first node to said second node in response to a second clock signal indicating a second mode when said first clock signal is in said first state;

wherein said master flip-flop includes:

a first transfer gate of a first type coupled to said input node;

a first inverter coupled between said first transfer gate and said first node;

a second inverter coupled to said first node; and a second transfer gate of a second type coupled to said second inverter and said first transfer gate;

said first and second transfer gates receiving said first clock signal;

wherein said slave flip-flop includes:

a third transfer gate of said second type coupled between said first node and said second node;

a third inverter coupled to said second node;

a fourth inverter coupled to said third inverter;

a fourth transfer gate of said first type coupled between said fourth inverter and said second node;

a fifth transfer gate of said second type coupled between said first node and said second node; and a sixth transfer gate of said first type coupled between said fourth inverter and said second node;

said third and sixth transfer gates receiving said first clock signal;

said fourth and fifth transfer gates receiving said second clock signal.

6. A method for operating a data latching circuit, comprising the steps of:

fetching said first data indicated by a first signal into a master flip-flop in response to a first clock signal;

holding said first data in said master flip-flop in response to said first clock signal;

outputting said first data as a second signal;

fetching second data corresponding to said second signal into a slave flip-flop in response to at least one of said first clock signal and said second clock signal;

holding said second data in said slave flip-flop in response to said at least one of said first and second clock signals; and outputting a third signal indicative of said second data from said slave flip-flop;

wherein said slave flip-flop receives further at least one third clock signal;

assuming now that the phase of said first clock signal is set to "0" and a total number of said second and third clock signals is selected to be "n" (symbol "n" being a natural number), the phase of each of said second and third clock signals is equal to any one of $2\pi i/(n+1)$ (symbol "i" being a natural number from 1 to "n").

* * * * *